(12) United States Patent
Chu-Kung et al.

(10) Patent No.: US 8,525,162 B2
(45) Date of Patent: Sep. 3, 2013

(54) METHOD OF ISOLATING NANOWIRES FROM A SUBSTRATE

(75) Inventors: Benjamin Chu-Kung, Hillsboro, OR (US); Uday Shah, Portland, OR (US); Ravi Pillarisetty, Portland, OR (US); Been-Yih Jin, Lake Oswego, OR (US); Marko Radosavljevic, Beaverton, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/291,682

(22) Filed: Nov. 8, 2011

(65) Prior Publication Data

US 2013/0062594 A1    Mar. 14, 2013

Related U.S. Application Data

(62) Division of application No. 12/346,554, filed on Dec. 30, 2008, now Pat. No. 8,168,508.

(51) Int. Cl.
*H01L 29/08* (2006.01)

(52) U.S. Cl.
USPC ......... 257/40; 257/19; 257/E21.301; 438/424

(58) Field of Classification Search
USPC ................ 438/343, 403, 443; 257/E21.014, 257/E21.02, E21.305
See application file for complete search history.

(56) References Cited

U.S. PATENT DOCUMENTS

| | | |
|---|---|---|
| 7,727,830 B2 | 6/2010 | Jin et al. |
| 7,851,790 B2 | 12/2010 | Rachmady et al. |
| 8,168,508 B2 | 5/2012 | Chu-Kung et al. |
| 2007/0029600 A1 | 2/2007 | Cohen |
| 2008/0237575 A1 | 10/2008 | Jin et al. |
| 2009/0170251 A1 | 7/2009 | Jin et al. |
| 2010/0163838 A1 | 7/2010 | Chu-Kung et al. |

*Primary Examiner* — Cheung Lee
(74) *Attorney, Agent, or Firm* — Winkle, PLLC

(57) ABSTRACT

A method is provided. The method includes forming a plurality of nanowires on a top surface of a substrate and forming an oxide layer adjacent to a bottom surface of each of the plurality of nanowires, wherein the oxide layer is to isolate each of the plurality of nanowires from the substrate.

16 Claims, 5 Drawing Sheets

METHOD OF ISOLATING NANOWIRES FROM A SUBSTRATE

CROSS REFERENCE TO RELATED APPLICATION

This application is a divisional of U.S. patent application Ser. No. 12/346,554.

BACKGROUND

Semiconductor nanowires have gained significant interest recently for their relevance to complementary metal-oxide-semiconductor (CMOS) scaling technology. Typically, previously condensed germanium nanowires are isolated from a substrate using either a wet etch undercut or through a silicon-on-insulator substrate. However, use of wet etch undercut in isolating the nanowires results in lifting lines. Further, the use of silicon-on-insulator substrate for isolating the nanowires is substantially expensive.

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

As discussed in detail below, the embodiments of the present invention function to provide a method for isolating nanowires from a substrate. In particular, the present technique uses selective vertical oxidation to form an oxide layer below the nanowires to separate the nanowires from the substrate.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The following description includes terms, such as top, bottom etc. that are used for descriptive purposes only and are not to be construed as limiting. The embodiments of the device or article described herein can be manufactured or used in a number of positions and orientations.

Figure 1:
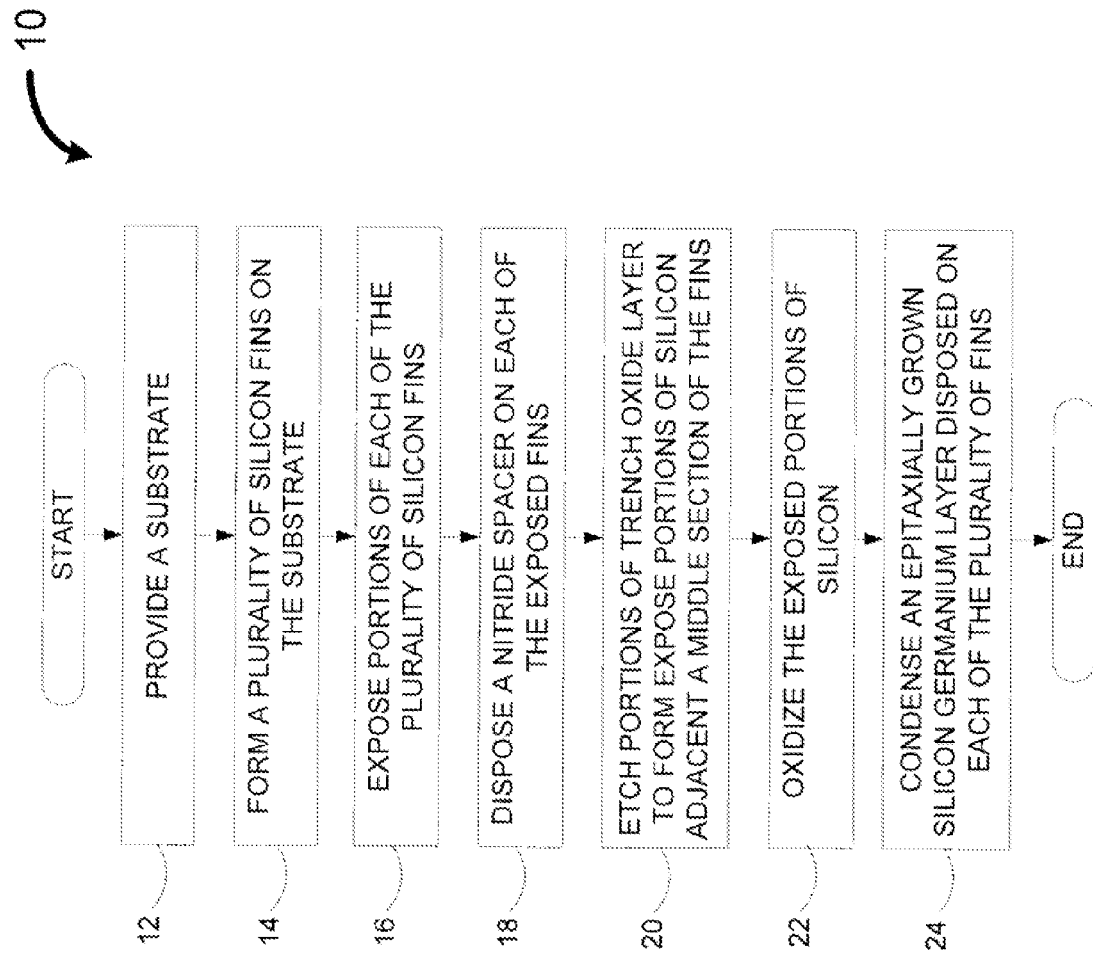
FIG. 1 illustrates an exemplary method for forming and isolating nanowires from a substrate in accordance with embodiments of present technique.

Referring first to FIG. 1, an exemplary method 10 for forming and isolating nanowires from a substrate is illustrated. At block 12, a silicon substrate is provided. Further, at block 14, a plurality of silicon fins are formed on a top surface of the silicon substrate. In this exemplary embodiment, a hard mask is deposited and patterned to form thin lines on the top surface of the silicon substrate. Subsequently, the hard mask is etched and the resist is removed to form the plurality of silicon fins.

At block 16, a portion of each of the plurality of silicon fins is exposed. In this exemplary embodiment, a plurality of trenches adjacent to each of the plurality of silicon fins are formed. Further, a trench oxide layer is deposited in each of the plurality of trenches. Subsequently, portions of the trench oxide layer are etched to expose portions of each of the plurality of fins. At block 18, a nitride spacer is disposed on a top surface of each of the exposed fins. Further, the nitride spacer is etched such that the hard mask is still disposed on each of the plurality of silicon fins and the trench oxide layer is exposed.

At block 20, portions of the trench oxide layer adjacent to a bottom surface of the nitride spacer are etched to form exposed portions of silicon in a middle section of each of the plurality of silicon fins. Further, at block 22, the exposed portions of the silicon are oxidized to form the oxide layer. In one exemplary embodiment, the oxide layer comprises silicon dioxide. Subsequently, the nitride spacer is removed.

At block 24, an epitaxially grown silicon germanium layer disposed on a top surface of each of the plurality of silicon fins is condensed to form a plurality of nanowires. In one embodiment, each of the plurality of nanowires includes germanium. As can be seen, the selective vertical oxidation of the plurality of silicon fins forms an oxide layer adjacent to the bottom surface of each of the plurality of nanowires. Such oxide layer is to isolate the plurality of nanowires from the substrate.

Figure 2:
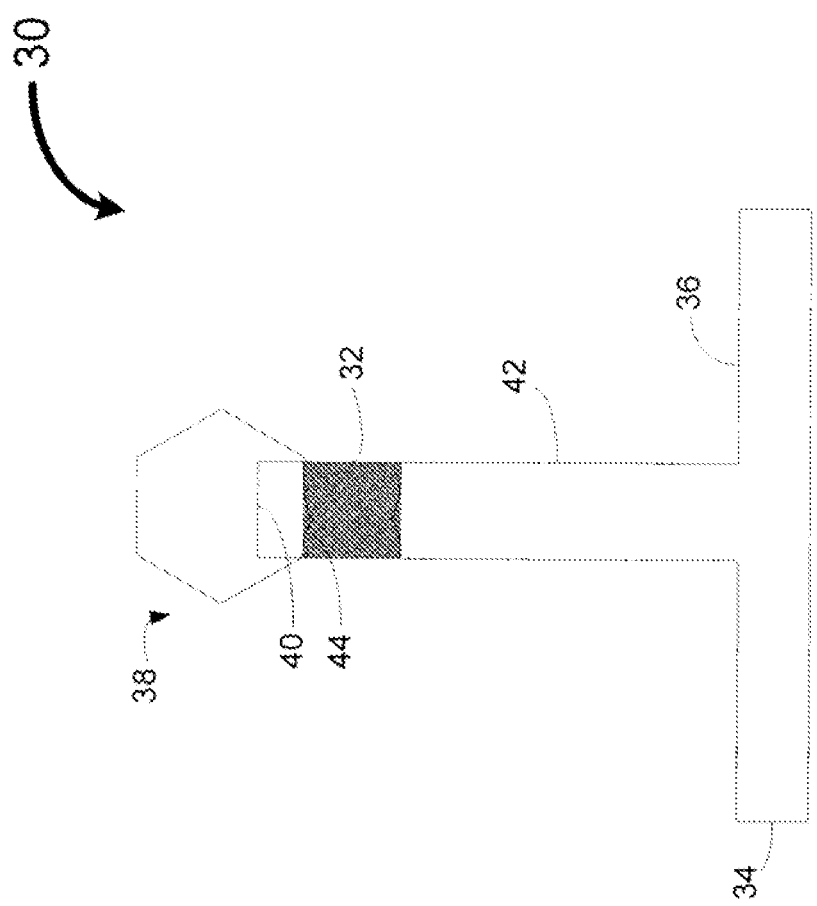
FIG. 2 illustrates an exemplary configuration of a device having an oxide layer in accordance with embodiments of present technique.

FIG. 2 illustrates an exemplary configuration 30 of a device having an oxide layer 32. The device 30 includes a substrate 34 and a plurality of nanowires (not shown) disposed on a top surface 36 of the substrate 34. In one exemplary embodiment, a diameter of each of the plurality of nanowires is about 30 nanometers. In one exemplary embodiment, the diameter of each of the plurality of nanowires is about 10 nanometers.

In this exemplary embodiment, the plurality of nanowires are formed by condensing an epitaxially grown silicon germanium layer 38. The silicon germanium layer 38 is disposed on a top surface 40 of each of a plurality of silicon fins such as represented by reference numeral 42 formed on the substrate 34. In this exemplary embodiment, the plurality of nanowires comprise germanium. In certain embodiments, the plurality of nanowires comprise silicon, or carbon, or tin, or combinations thereof.

In the illustrated embodiment, the device 30 includes the oxide layer 32 disposed adjacent to a bottom surface 44 of each of the plurality of nanowires. The oxide layer 32 is to isolate each of the plurality of nanowires from the substrate 34. In this exemplary embodiment, the oxide layer 32 is formed by selective vertical oxidation of the silicon fin 42. In one exemplary embodiment, the oxide layer 32 includes silicon dioxide. In one exemplary embodiment, a thickness of the oxide layer 32 is about half the diameter of the nanowire. The selective vertical oxidation of the silicon fin 42 will be described in detail with reference to FIGS. 3-6.

Figure 3:
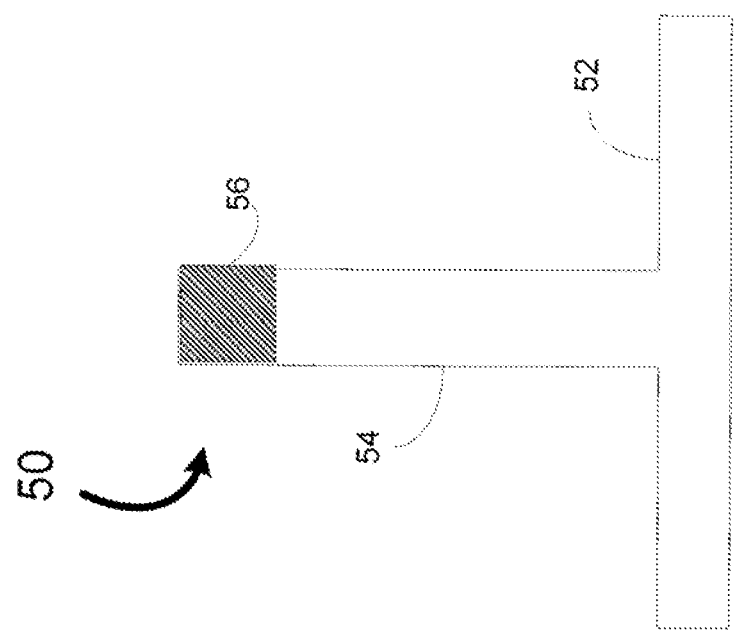
FIG. 3 illustrates an exemplary configuration of a substrate having a silicon fin in accordance with embodiments of present technique.

FIG. 3 illustrates an exemplary configuration 50 of a substrate 52 having a silicon fin 54. In this exemplary embodiment, a hard mask such as represented by reference numeral 56 is deposited and patterned to create thin lines. Subsequently, the hard mask 56 is etched and resist is removed. The hard mask 56 is employed to etch the silicon into narrow lines to form a plurality of silicon fins such as represented by reference numeral 54.

Figure 4:
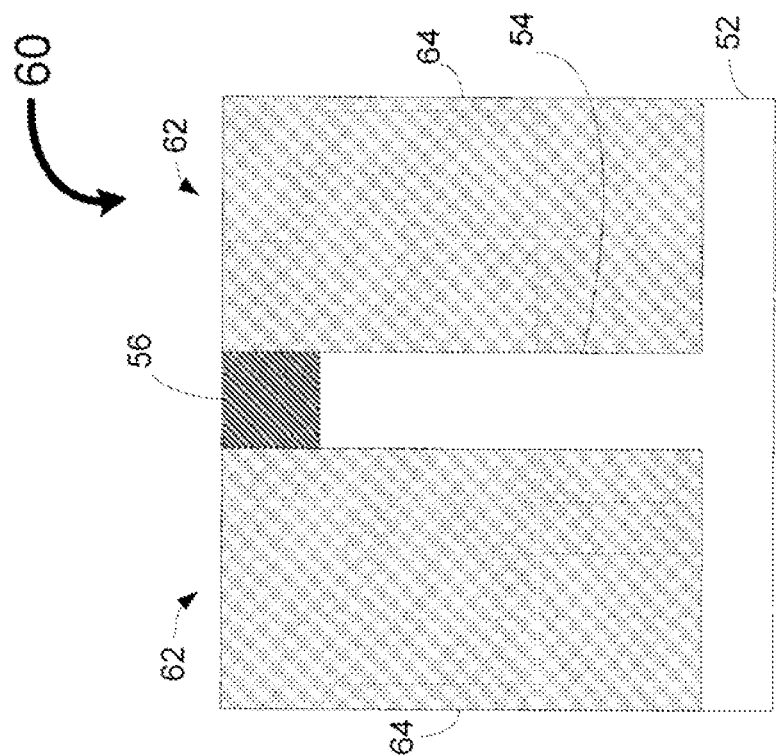
FIG. 4 illustrates an exemplary configuration of the device of FIG. 3 with trenches in accordance with embodiments of present technique.

FIG. 4 illustrates an exemplary configuration 60 of the device of FIG. 3 with trenches such as represented by reference numeral 62. As illustrated, a plurality of trenches 62 are formed adjacent to each of the plurality of silicon fins 54. Further, a trench oxide layer 64 is deposited in each of the plurality of trenches 62. In one exemplary embodiment, the trench oxide layer 64 includes silicon dioxide ($SiO_2$). The excess trench oxide may be polished. Further, as represented in exemplary configuration 70 of FIG. 5, the trench oxide layer 64 is selectively etched to form etched portions 72 to expose each of the plurality of silicon fins 54. In one exemplary embodiment, the length of the exposed portions of the silicon fins 54 is about double of a width of the silicon fin.

Figure 6:
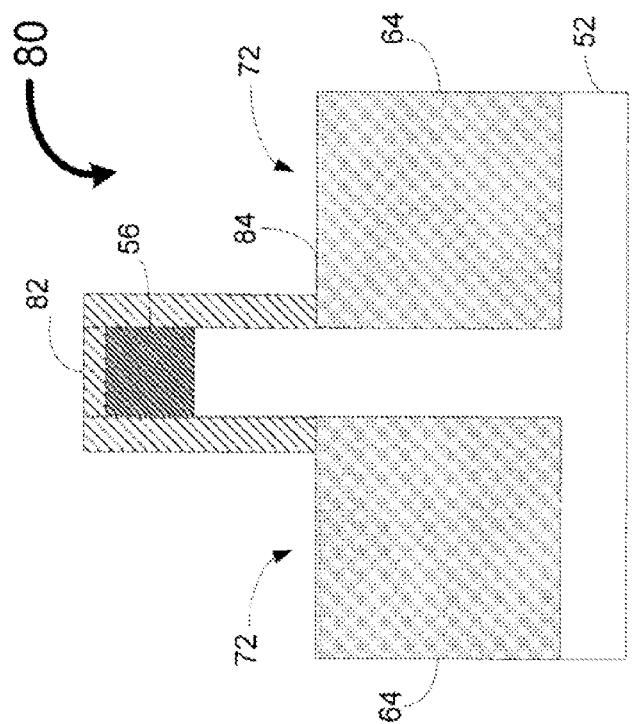
FIG. 6 illustrates an exemplary configuration of the device of FIG. 5 with a nitride spacer in accordance with embodiments of present technique.
Figure 5:
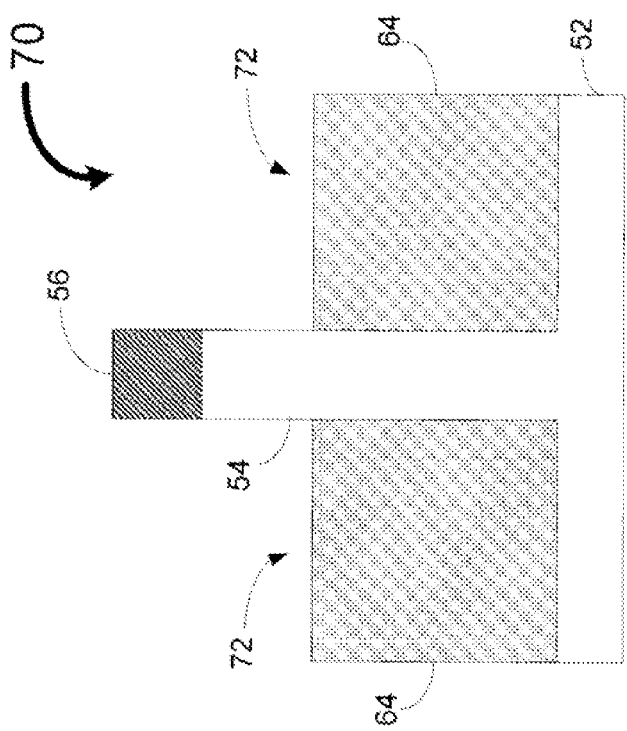
FIG. 5 illustrates an exemplary configuration of the device of FIG. 4 with etched portions of trench oxide layer in accordance with embodiments of present technique.

FIG. 6 illustrates an exemplary configuration 80 of the device of FIG. 5 with a nitride spacer 82. As illustrated, a nitride spacer 82 is disposed on a top surface 84 of each of the exposed fins 54. The nitride spacer 82 may be deposited in the exposed fins 54 using known deposition techniques such as chemical vapor deposition or atomic layer deposition. In the illustrated embodiment, the nitride spacer 82 is etched such that the hard mask 56 is still disposed on each of the plurality of silicon fins 54 and the trench oxide layer 64 is exposed.

Subsequently, the trench oxide layer 64 is further etched to form an exposed silicon section adjacent to the middle of the fin 54. Such exposed portions are then oxidized to form the oxide layer 32 (see FIG. 2). On oxidation, the exposed silicon section other than the areas encased by the trench oxide layer 64 and the nitride spacer 82 starts growing the oxide.

The nitride spacer 82 and the hard mask 56 may be subsequently removed by phosphoric etch or using a selective dry etch to form a silicon wedge that is isolated from the substrate 52 by the thermally grown oxide layer 32. Advantageously, the technique described above facilitates forming silicon fins of varying heights as compared to conventional silicon-on-insulator substrates. Further, it also allows incorporating multiple fin heights on a single substrate. Further, as illustrated in FIG. 2 a silicon germanium layer 38 is epitaxially grown adjacent the thermally grown oxide layer 32. The epitaxially grown silicon germanium layer 38 is condensed to form the nanowires on the substrate.

Figure 7:
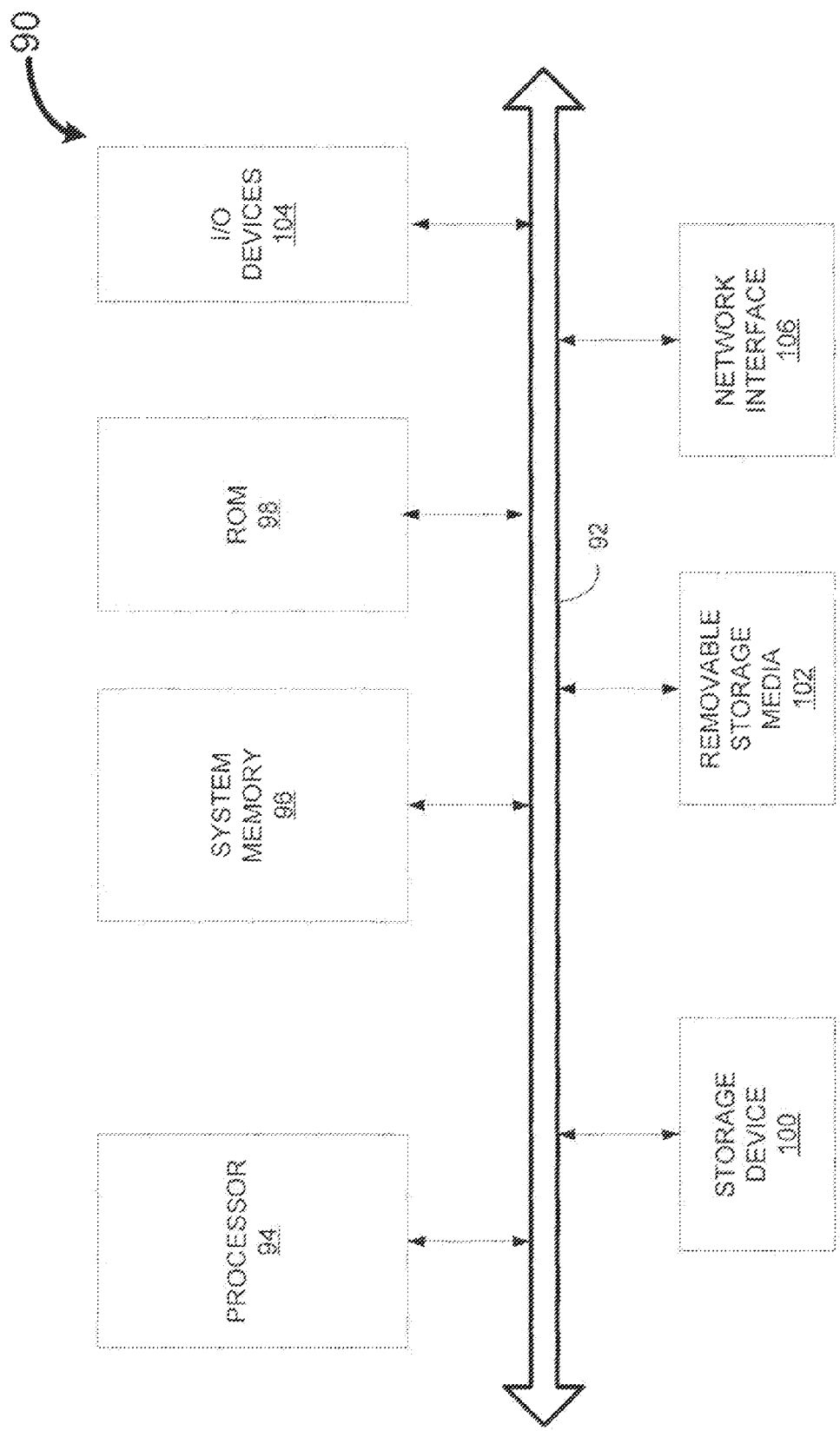
FIG. 7 illustrates an embodiment of a computer system in accordance with embodiments of present technique.

The device described above may be disposed in a computer system, a wireless communicator and a hand-held device. FIG. 7 illustrates an embodiment of a computer system 90. The computer system 90 includes a bus 92 to which the various components are coupled. In certain embodiments, the bus 92 includes a collection of a plurality of buses such as a system bus, a Peripheral Component Interface (PCI) bus, a Small Computer System Interface (SCSI) bus, etc. Representation of these buses as a single bus 92 is provided for ease of illustration, and it should be understood that the system 90 is not so limited. Those of ordinary skill in the art will appreciate that the computer system 90 may have any suitable bus architecture and may include any number of combination of buses.

A processor 94 is coupled to the bus 92. The processor 94 may include any suitable processing device or system, including a microprocessor (e.g., a single core or a multi-core processor), a network processor, an application specific integrated circuit (ASIC), or a field programmable gate array (FPGA), or any similar device. It should be noted that although FIG. 7 shows a single processor 94, the computer system 90 may include two or more processors.

The computer system 90 further includes system memory 96 coupled to the bus 92. The system memory 96 may include any suitable type and number of memories, such as static random access memory (SRAM), dynamic random access memory (DRAM), synchronous dynamic random access memory (SDRAM), or double data rate DRAM (DDRDRAM). During operation of the computer system 90, an operating system and other applications may be resident in the system memory 96.

The computer system 90 may further include a read-only memory (ROM) 98 coupled to the bus 92. The ROM 138 may store instructions for the processor 94. The computer system 90 may also include a storage device (or devices) 100 coupled to the bus 92. The storage device 100 includes any suitable non-volatile memory, such as, for example, a hard disk drive. The operating system and other programs may be stored in the storage device 100. Further, a device 102 for accessing removable storage media (e.g., a floppy disk drive or a CD ROM drive) may be coupled to the bus 92.

The computer system 90 may also include one or more Input/Output (I/O) devices 104 coupled to the bus 92. Common input devices include keyboards, pointing devices such as a mouse, as well as other data entry devices. Further, common output devices include video displays, printing devices, and audio output devices. It will be appreciated that these are but a few examples of the types of I/O devices that may be coupled to the computer system 90.

The computer system 90 may further comprise a network interface 106 coupled to the bus 92. The network interface 106 comprises any suitable hardware, software, or combination of hardware and software that is capable of coupling the system 90 with a network (e.g., a network interface card). The network interface 106 may establish a link with the network over any suitable medium (e.g., wireless, copper wire, fiber optic, or a combination thereof) supporting exchange of information via any suitable protocol such as TCP/IP (Transmission Control protocol/Internet Protocol), HTTP (HyperText Transmission Protocol, as well as others.

It should be understood that the computer system 90 illustrated in FIG. 7 is intended to represent an embodiment of such a system and, further, that this system may include any additional components, which have been omitted for clarity and ease of understanding. By way of example, the system 90 may include a direct memory access (DMA) controller, a chip set associated with the processor 94, additional memory (e.g., cache memory) as well as additional signal lines and buses. Also, it should be understood that the computer system 90 may not include all the components shown in FIG. 7. The computer system 90 may comprise any type of computing device, such as a desktop computer, a laptop computer, a server, a hand-held computing device, a wireless communication device, an entertainment system etc.

In this embodiment, the computer system 90 may include the device as described in the embodiments above. By way of example, the processor 134 may include a plurality of transistors formed on a semiconductor substrate. Each of the plurality of transistors may include a plurality of nanowires separated from a substrate through an oxide layer disposed adjacent to a bottom surface of each of the plurality of nanowires.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

The invention claimed is:

1. A device, comprising:
 a plurality of fins on a silicon substrate;
 an oxide layer formed within each of the plurality of fins, wherein a portion of the fin resides above the oxidized portion and a portion of the fin resides below the oxidized portion; and
 a nanowire formed on each of the plurality of fins adjacent to the portion of the fins residing above the oxidized portion of the fins.

2. The device of claim 1, wherein the plurality of fins comprises a plurality of silicon-containing fins.

3. The device of claim 1, wherein the plurality of nanowires comprise germanium.

4. The device of claim 3, wherein the plurality nanowires comprise an epitaxially grown silicon germanium layer disposed on each of the plurality of fins adjacent to the portion of the fins residing above the oxidized portion of the fins.

5. The device of claim 1, wherein the plurality of nanowires comprise silicon, carbon, tin, or combinations thereof.

6. The device of claim 1, wherein a diameter of the nanowires is between about 5 nanometers and about 60 nanometers.

7. The device of claim 1, wherein a diameter of the nanowires is about 10 nanometers.

8. The device of claim 1, wherein a thickness of the oxide layer is about half of the diameter of each of the plurality of nanowires.

9. A system, comprising:
 a processor having a plurality of transistors formed on a semiconductor substrate, wherein the plurality of transistors comprise:
  a plurality of fins on a silicon substrate;
  an oxide layer formed within each of the plurality of fins, wherein a portion of the fin resides above the oxidized portion and a portion of the fin resides below the oxidized portion; and
  a nanowire formed on each of the plurality of fins adjacent to the portion of the fins residing above the oxidized portion of the fins; and
 a removable storage media.

10. The system of claim 9, wherein the plurality of fins comprises a plurality of silicon-containing fins.

11. The system of claim 9, wherein the plurality of nanowires comprise germanium.

12. The system of claim 11, wherein the plurality of nanowires comprise an epitaxially grown silicon germanium layer disposed on each of the plurality of fins adjacent to the portion of the fins residing above the oxidized portion of the fins.

13. The system of claim 9, wherein the plurality of nanowires comprise silicon, carbon, tin, or combinations thereof.

14. The system of claim 9, wherein a diameter of the nanowires is between about 5 nanometers and about 60 nanometers.

15. The system of claim 9, wherein a diameter of the nanowires is about 10 nanometers.

16. The system of claim 9, wherein a thickness of the oxide layer is about half of the diameter of each of the plurality of nanowires.

* * * * *

UNITED STATES PATENT AND TRADEMARK OFFICE
CERTIFICATE OF CORRECTION

PATENT NO.       : 8,525,162 B2
APPLICATION NO.  : 13/291682
DATED            : September 3, 2013
INVENTOR(S)      : Benjamin Chu-Kung et al.

It is certified that error appears in the above-identified patent and that said Letters Patent is hereby corrected as shown below:

In the Claims:

In column 5, line 28, in claim 4, after "plurality" insert -- of --.

Signed and Sealed this
Twenty-sixth Day of November, 2013

Margaret A. Focarino
*Commissioner for Patents of the United States Patent and Trademark Office*